United States Patent
Yamada

(10) Patent No.: US 9,653,569 B1
(45) Date of Patent: May 16, 2017

(54) COMPOUND SEMICONDUCTOR DEVICE AND MANUFACTURING METHOD THEREOF

(71) Applicant: FUJITSU LIMITED, Kawasaki-shi, Kanagawa (JP)

(72) Inventor: Atsushi Yamada, Isehara (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/283,911

(22) Filed: Oct. 3, 2016

(30) Foreign Application Priority Data

Oct. 30, 2015 (JP) ................................ 2015-215109

(51) Int. Cl.
| | | |
|---|---|---|
| *H01L 31/0256* | (2006.01) | |
| *H01L 21/00* | (2006.01) | |
| *H01L 29/66* | (2006.01) | |
| *H01L 29/778* | (2006.01) | |
| *H01L 29/08* | (2006.01) | |
| *H01L 29/207* | (2006.01) | |
| *H01L 29/20* | (2006.01) | |
| *H01L 21/225* | (2006.01) | |

(52) U.S. Cl.
CPC .... *H01L 29/66462* (2013.01); *H01L 21/2258* (2013.01); *H01L 29/0847* (2013.01); *H01L 29/2003* (2013.01); *H01L 29/207* (2013.01); *H01L 29/7786* (2013.01)

(58) Field of Classification Search
CPC .......... H01L 21/2258; H01L 29/66462; H01L 29/7786; H01L 29/0847
USPC .............................................. 257/76; 438/44
See application file for complete search history.

(56) References Cited

U.S. PATENT DOCUMENTS

| | | | | |
|---|---|---|---|---|
| 7,786,509 | B2 * | 8/2010 | Mishima | H01L 29/0843 257/194 |
| 7,901,994 | B2 * | 3/2011 | Saxler | H01L 29/66462 438/123 |
| 9,437,723 | B2 * | 9/2016 | Nishimori | H01L 29/778 |
| 2007/0158683 | A1 * | 7/2007 | Sheppard | H01L 21/046 257/183 |
| 2009/0001423 | A1 | 1/2009 | Mishima et al. | |
| 2009/0267078 | A1 * | 10/2009 | Mishra | H01L 29/2003 257/76 |

(Continued)

FOREIGN PATENT DOCUMENTS

| | | |
|---|---|---|
| JP | 2008-147311 A | 6/2008 |
| JP | 2015-037105 A | 2/2015 |

OTHER PUBLICATIONS

F. A. Faria et al., "Ultra-Low Resistance Ohmic Contacts to GaN with High Si Doping Concentrations Grown by Molecular Beam Epitaxy", Applied Physics Letters, 101, 032109 (2012) published by AIP Publishing (Total pp. 5).

*Primary Examiner* — David S Blum
(74) *Attorney, Agent, or Firm* — Fujitsu Patent Center

(57) ABSTRACT

A compound semiconductor stacked structure is constituted by including: a buffer layer; an n-type conductive region that is formed at one portion of the buffer layer; an channel layer that is formed on a top surface of the buffer layer and on a top surface of the n-type conductive region; and an barrier layer that is formed above the channel layer and contains $In_{x1}Al_{y1}Ga_{z1}N$ ($0 \leq x1 < 1$, and $0 < y1 < 1$, and $0 \leq z1 < 1$, and $x1+z1>0$, and $x1+y1+z1=1$); and includes electrodes that are formed on the n-type conductive region.

13 Claims, 14 Drawing Sheets

(56) References Cited

U.S. PATENT DOCUMENTS

2014/0134773 A1* 5/2014 Jain .................. H01L 33/32
                                                            438/44
2015/0041860 A1   2/2015 Nishimori et al.
2015/0144957 A1* 5/2015 Lu .................... H01L 29/7787
                                                            257/76

* cited by examiner

COMPOUND SEMICONDUCTOR DEVICE AND MANUFACTURING METHOD THEREOF

CROSS-REFERENCE TO RELATED APPLICATION

This application is based upon and claims the benefit of priority of the prior Japanese Patent Application No. 2015-215109, filed on Oct. 30, 2015, the entire contents of which are incorporated herein by reference.

FIELD

The embodiments discussed herein are directed to a compound semiconductor device and a manufacturing method thereof.

BACKGROUND

There is considered application of a nitride semiconductor to a semiconductor device with high withstand voltage and high output power, utilizing characteristics such as high saturation electron speed and wide band gap. For example, the band gap of GaN as the nitride semiconductor is 3.4 eV, which is larger than the band gap of Si (1.1 eV) and the band gap of GaAs (1.4 eV), and thus GaN has high breakdown electric field intensity. Accordingly, GaN is quite promising as a material of a semiconductor device for power supply that obtains high voltage operation and high output power.

As a semiconductor device using the nitride semiconductor, there have been made numerous reports on a field effect transistor, particularly a high electron mobility transistor (HEMT). Particularly, studies on an InAlN-HEMT using InAlN as an barrier layer have been conducted actively in recent years. InAlN has been known to lattice match to GaN in the composition of In being 17% to 18%. Further, in this composition region, InAlN has very high spontaneous polarization, to make it possible to achieve two-dimensional electron gas (2DEG) having a concentration higher than that of a conventional AlGaN-HEMT. For this reason, the InAlN-HEMT is attracting attention as a next-generation device with high output power.

[Patent Document 1] Japanese Laid-open Patent Publication No. 2008-147311

[Patent Document 2] Japanese Laid-open Patent Publication No. 2015-37105

[Non-Patent Document 1] F. A. Faria et al., "Ultra-low resistance ohmic contacts to GaN with high Si doping concentrations grown by molecular beam epitaxy," Appl. Phys. Lett., 101, (2012) 032109.

The InAlN-HEMT has a problem that a contact resistance is high due to its large band gap. As a solution of this problem, there has been proposed a method in which InAlN in a source drain region is removed by etching to regrow donor-doped n-type GaN (n-GaN) (see Non-Patent Document 1). However, this method has a problem that by a heat treatment at the time of regrowth of n-GaN, InAlN in an access region is damaged and resistance increases. Further, n-GaN and 2DEG are in line contact with each other, thus also causing a problem that a contact area of n-GaN and 2DEG is small and a contact resistance is high.

SUMMARY

One aspect of a compound semiconductor device includes: a buffer layer; an n-type conductive region that is formed at one portion of the buffer layer; an channel layer that is formed on a top surface of the buffer layer and on a top surface of the n-type conductive region; an barrier layer that is formed above the channel layer and contains $In_{x1}Al_{y1}Ga_{z1}N$ ($0 \le x1 < 1$, and $0 < y1 < 1$, and $0 \le z1 < 1$, and $x1+z1>0$, and $x1+y1+z1=1$); and an electrode that is formed on the n-type conductive region.

One aspect of a manufacturing method of a compound semiconductor device includes: forming a buffer layer; forming an n-type conductive region at one portion of the buffer layer; forming an channel layer on a top surface of the buffer layer and on a top surface of the n-type conductive region; forming, above the channel layer, an barrier layer that contains $In_{x1}Al_{y1}Ga_{z1}N$ ($0 \le x1 < 1$, and $0 < y1 < 1$, and $0 \le z1 < 1$, and $x1+z1>0$, and $x1+y1+z1=1$); and forming an electrode on the n-type conductive region.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

First Embodiment

This embodiment discloses a Schottky type InAlN/GaN-HEMT as a compound semiconductor device.

FIG. 1A to FIG. 3B are schematic cross-sectional views each illustrating a manufacturing method of the InAlN/GaN-HEMT according to the first embodiment in order of processes.

Figure 1A:
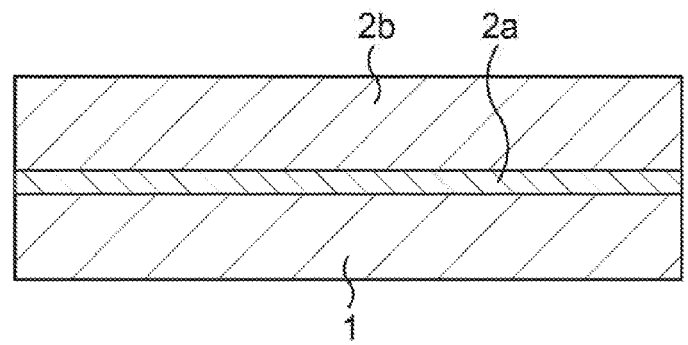
FIG. 1A to FIG. 1C are schematic cross-sectional views each illustrating a manufacturing method of an InAlN/GaN-HEMT according to a first embodiment in order of processes.
Figure 1B:
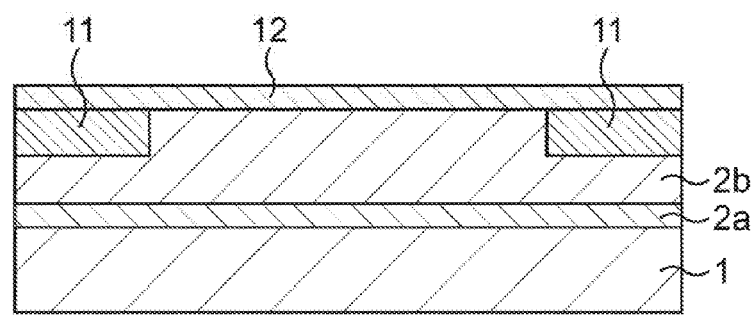
Figure 1C:
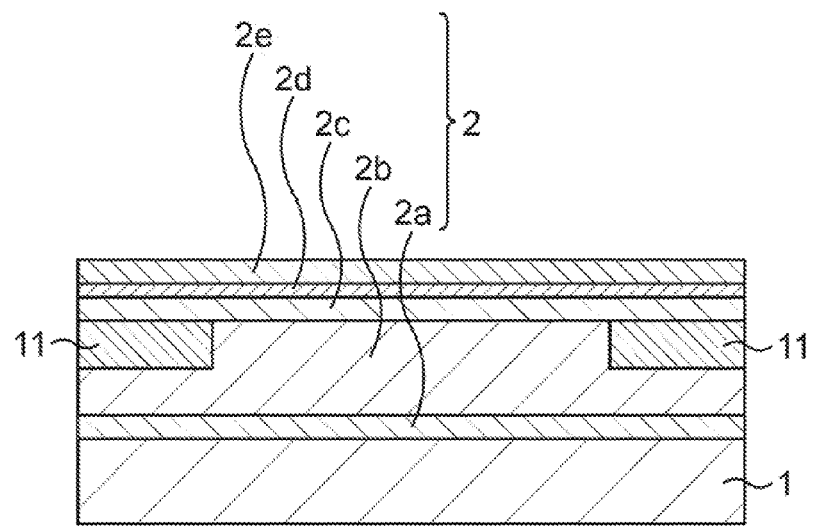

In this embodiment, as illustrated in FIG. 1A to FIG. 1C, a compound semiconductor stacked structure 2 is formed on, for example, an SiC substrate 1 as a growth substrate.

The compound semiconductor stacked structure 2 is constituted by including: a nucleation layer 2a; a buffer layer 2b; an channel layer 2c; a spacer layer 2d; and an barrier layer 2e, and including n-type contact regions 11 formed in one portion (a surface layer portion) of the buffer layer 2b. On the barrier layer 2e, a cap layer of GaN, AlN, or the like may also be formed.

In a completed InAlN/GaN-HEMT, two-dimensional electron gas (2DEG) occurs in the vicinity of an interface of the channel layer 2c with the barrier layer 2e (accurately, in the vicinity of an interface of the channel layer 2c with the spacer layer 2d) at the time of its operation. This 2DEG is generated based on a difference in spontaneous polarization between a compound semiconductor (here, GaN) of the channel layer 2c and a compound semiconductor (here, InAlN) of the barrier layer 2e.

In formation of each of the layers constituting the compound semiconductor stacked structure 2, each compound semiconductor below is grown by, for example, a metal organic vapor phase epitaxy (MOVPE) method. A molecular beam epitaxy (MBE) method or the like may also be used in place of the MOVPE method.

A growth condition of AlN is that a mixed gas of a trimethylaluminum (TMAl) gas and an ammonia ($NH_3$) gas is used as a source gas. A growth condition of GaN is that a mixed gas of a trimethylgallium (TMGa) gas and an $NH_3$ gas is used as a source gas. A growth condition of InAlN is that a mixed gas of a trimethylindium (TMIn) gas, a TMAl gas, and an $NH_3$ gas is used as a source gas. Presence and absence of supplies and flow amounts of the TMAl gas being an Al source, the TMGa gas being a Ga source, and the TMIn gas being an In source are appropriately set in accordance with compound semiconductor layers to grow.

The flow amount of the $NH_3$ gas being a common source is set to about 100 sccm to 20 slm. Besides, a growth pressure is set to about 5 kPa to about 100 kPa, and a growth temperature is set to about 700° C. to 1200° C.

Concretely, as illustrated in FIG. 1A, the nucleation layer 2a and the buffer layer 2b are first formed sequentially.

More specifically, by the MOVPE method, for example, on the SiC substrate 1 as a growth substrate, AlN is grown to have a thickness of about 100 nm, and GaN is grown to have a thickness of about 3 μm sequentially. Thereby, the nucleation layer 2a and the buffer layer 2b are formed in layers on the SiC substrate 1. As the growth substrate, an Si substrate, a sapphire substrate, a GaAs substrate, a GaN substrate, or the like may also be used in place of the SiC substrate. Further, the conductivity of the substrate may be either semi-insulating or insulating.

Subsequently, as illustrated in FIG. 1B, the contact regions 11 are formed.

More specifically, an n-type impurity, Si here, is ion-implanted into source electrode and drain electrode formation planned sites of the surface of the buffer layer 2b. A dose amount of the ion implantation is set to about $1\times10^{13}/cm^2$ and an acceleration voltage is set to about 20 keV. Thereby, the contact regions 11 are formed in one portion (the surface layer portion) of the buffer layer 2b. The Si concentration of the contact region 11 is set to a value falling within a range of about $1\times10^{17}/cm^3$ to about $1\times10^{21}/cm^3$. When the concentration is lower than about $1\times10^{17}/cm^3$, sufficient conductivity cannot be obtained. When the concentration is higher than about $1\times10^{21}/cm^3$, an adverse effect on the channel layer 2c and the like is concerned. The Si concentration falling within a range of about $1\times10^{17}/cm^3$ to about $1\times10^{21}/cm^3$ is set, thereby making it possible to obtain sufficient conductivity without adversely affecting the channel layer 2c and the like. As the n-type impurity for the ion implantation, one type or two or more types selected from Si, Ge, Sn, and O can be used.

Then, on the buffer layer 2b and on the contact regions 11, a protective film 12 being a silicon oxide film or the like is formed by a thermal CVD method, for example, to be heat treated. The temperature of the heat treatment is about 1000° C. or more, and is set to about 1100° C. here. This heat treatment activates Si added into the contact regions 11 and recovers crystallinity of GaN of the contact regions 11 (the buffer layer 2b). Thereafter, the protective film 12 is removed by wet etching.

Subsequently, as illustrated in FIG. 1C, the channel layer 2c, the spacer layer 2d, and the barrier layer 2e are formed sequentially.

More specifically, by the MOVPE method, on the top surface of the buffer layer 2b and on the top surface of the contact regions 11, GaN is grown to have a thickness of about 30 nm, AlN is grown to have a thickness of about 1 nm, and InAlN is grown to have a thickness of about 10 nm respectively. Thereby, the channel layer 2c, the spacer layer 2d, and the barrier layer 2e are formed in layers on the top surface of the buffer layer 2b and on the top surface of the contact regions 11. GaN of the channel layer 2c contains an n-type impurity of an i type or an n-type impurity having a low concentration ($1\times10^{17}/cm^3$ or less) to the extent that it is evaluated as an i type. As for InAlN of the barrier layer 2e, for the purpose of increasing the spontaneous polarization of InAlN, the composition of In is preferably set to 20% or less. The composition of In is set to about 18% here. Thereby, the compound semiconductor stacked structure 2 including: the nucleation layer 2a; the buffer layer 2b; the channel layer 2c; the spacer layer 2d; and the barrier layer 2e, and including the n-type contact regions 11 formed in one portion (the surface layer portion) of the buffer layer 2b is formed.

As for the spacer layer 2d, AlGaN or InAlGaN may also be formed in place of AlN. However, the composition of In is preferably set to 5% or less for the purpose of suppressing occurrence of alloy scattering. The composition of the spacer layer 2d can be represented as $In_{x3}Al_{y3}Ga_{1-x3-y3}N$ ($0 \leq x3 \leq 0.05$ and $0 < y3 \leq 1$).

Subsequently, for example, argon (Ar) is injected into element isolation regions of the compound semiconductor stacked structure 2. Thereby, element isolation structures (not-illustrated) are formed in the surface layer portion of the compound semiconductor stacked structure 2. Active regions are defined on the compound semiconductor stacked structure 2 by the element isolation structures.

Note that the element isolation may also be performed by using, for example, a STI (Shallow Trench Isolation) method in place of the above-described injection method. At this time, a chlorine-based etching gas, for example, is used for dry-etching of the compound semiconductor stacked structure 2.

Figure 2A:
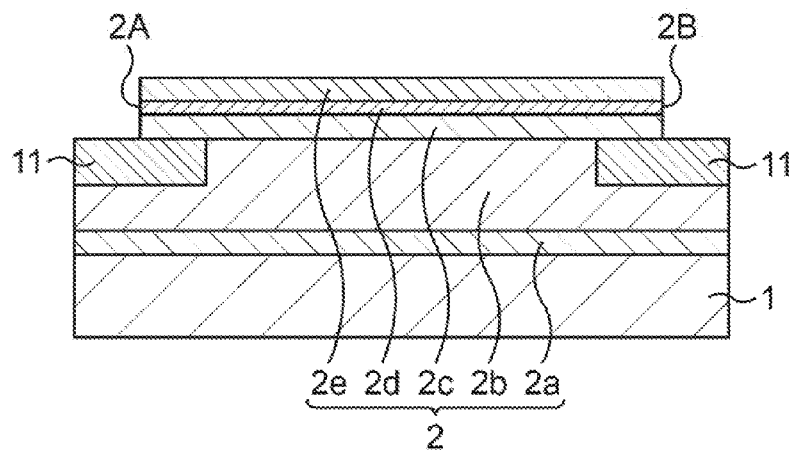
FIG. 2A to FIG. 2C are schematic cross-sectional views, subsequent to FIG. 1A to FIG. 1C, each illustrating the manufacturing method of the InAlN/GaN-HEMT according to the first embodiment in order of processes.

Subsequently, as illustrated in FIG. 2A, electrode trenches 2A and 2B are formed at source electrode and drain electrode formation planned positions (electrode formation planned positions) in the surface of the compound semiconductor stacked structure 2.

More specifically, a resist is applied on the surface of the compound semiconductor stacked structure 2. The resist is processed by lithography to form therein openings to expose the surface of the compound semiconductor stacked structure 2 corresponding to the electrode formation planned positions. Thereby, a resist mask having the openings is formed.

With the use of this resist mask, the electrode formation planned positions of the channel layer 2c, the spacer layer 2d, and the barrier layer 2e are removed by dry etching until the surface of the contact regions 11 is exposed. Thereby, the electrode trenches 2A and 2B exposing the electrode formation planned positions of the surface of the contact regions 11 are formed. An etching condition is set that an inert gas such as Ar and a chlorine-based gas such as $Cl_2$ are used as an etching gas, a flow amount of, for example, $Cl_2$ is about 30 sccm, a pressure is about 2 Pa, and an RF input power is about 20 W. Thereafter, the resist mask is removed by ashing or the like.

Figure 2B:
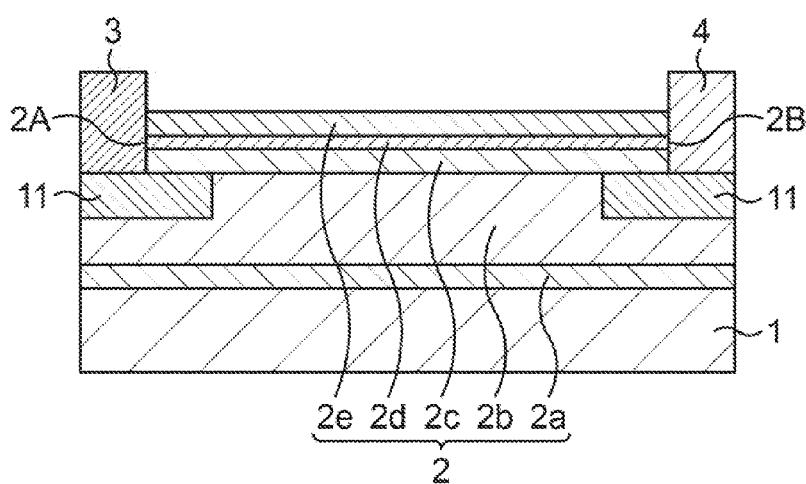

Subsequently, as illustrated in FIG. 2B, a source electrode 3 and a drain electrode 4 are formed.

More specifically, a resist mask for forming the source electrode and the drain electrode is first formed. Here, for example, an eaves-structure two-layer resist suitable for a vapor deposition method and a lift-off method is used. This resist is applied on the compound semiconductor stacked structure 2 to form therein openings exposing the electrode trenches 2A and 2B. Thereby, the resist mask having the openings is formed.

With the use of this resist mask, as an electrode material, for example, Ta/Al are deposited on the resist mask including the insides of the openings that expose the electrode trenches 2A and 2B by the vapor deposition method, for example. The thickness of Ta is set to about 20 nm, and the thickness of Al is set to about 200 nm. By the lift-off method, the resist mask and Ta/Al deposited thereon are removed. Thereafter, the SiC substrate 1 is heat treated at a temperature of about 400° C. to 1000° C., for example, about 550° C. in a nitrogen atmosphere, for example, and remaining Ta/Al are brought into ohmic contact with the contact regions 11 to establish an ohmic characteristic. As long as the ohmic characteristic of Ta/Al with the contact regions 11 can be obtained, there is sometimes a case that the heat treatment is unnecessary. Thereby, the source electrode 3 and the drain electrode 4 made by embedding part of the electrode material in the electrode trenches 2A and 2B are formed.

Figure 2C:
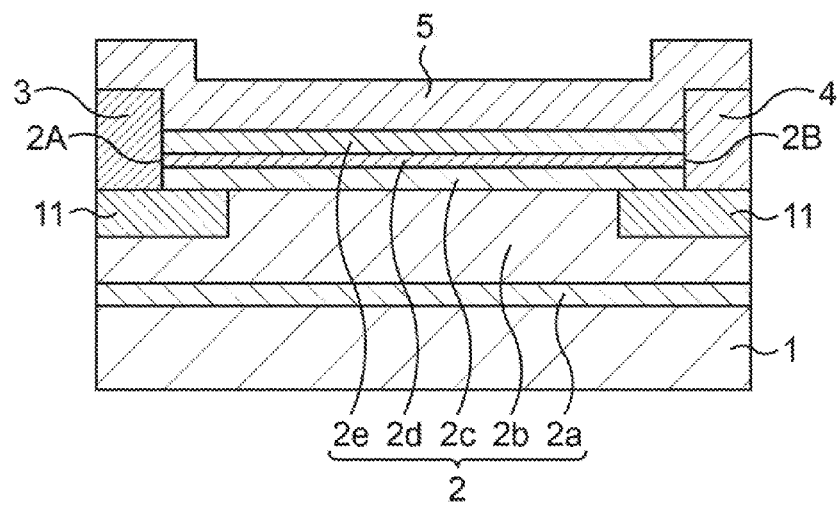

Subsequently, as illustrated in FIG. 2C, a passivation film 5 is formed.

More specifically, an insulating material, for example, a silicon nitride (SiN) is deposited on the entire surface of the compound semiconductor stacked structure 2 to have a thickness of, for example, about 2 nm to about 500 nm, for example, about 100 nm by using a plasma CVD method or the like. Thereby, the passivation film 5 is formed. In place of the plasma CVD method, an ALD method or a sputtering method may also be used. As the material for the passivation film 5, oxides, nitrides, and oxynitrides of Si, Al, Hf, Zr, Ti, Ta, or W are preferred.

Figure 3A:
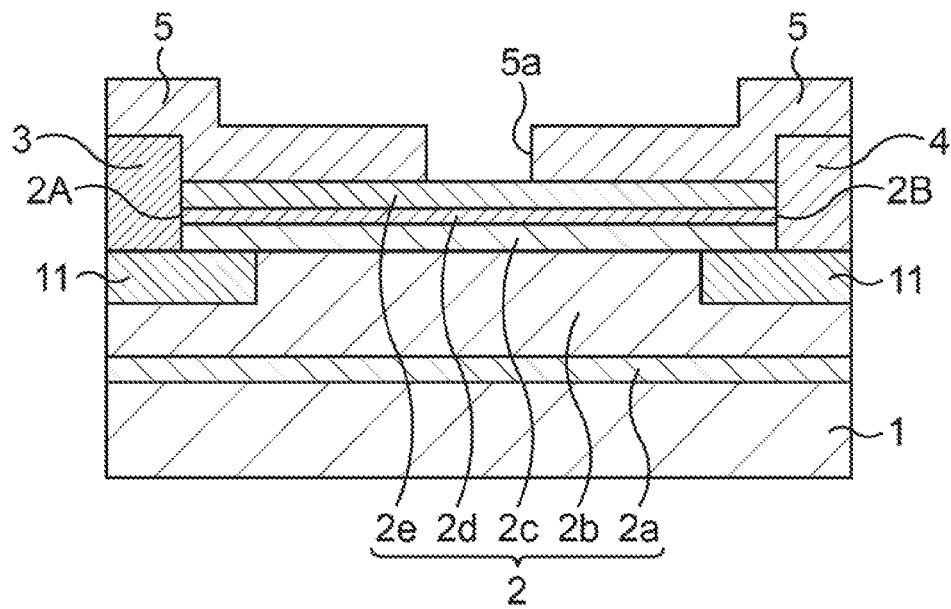
FIG. 3A and FIG. 3B are schematic cross-sectional views, subsequent to FIG. 2A to FIG. 2C, each illustrating the manufacturing method of the InAlN/GaN-HEMT according to the first embodiment in order of processes.

Subsequently, as illustrated in FIG. 3A, an electrode trench 5a is formed in the passivation film 5.

More specifically, the passivation film 5 is first processed by lithography and dry etching. For the dry etching, a fluorine-based gas or chlorine-based gas is used. Thereby, the electrode trench 5a being a through trench that exposes the surface of the barrier layer 2e is formed in the passivation film 5.

A resist mask is removed by ashing using oxygen plasma or wetting using a chemical solution.

Figure 3B:
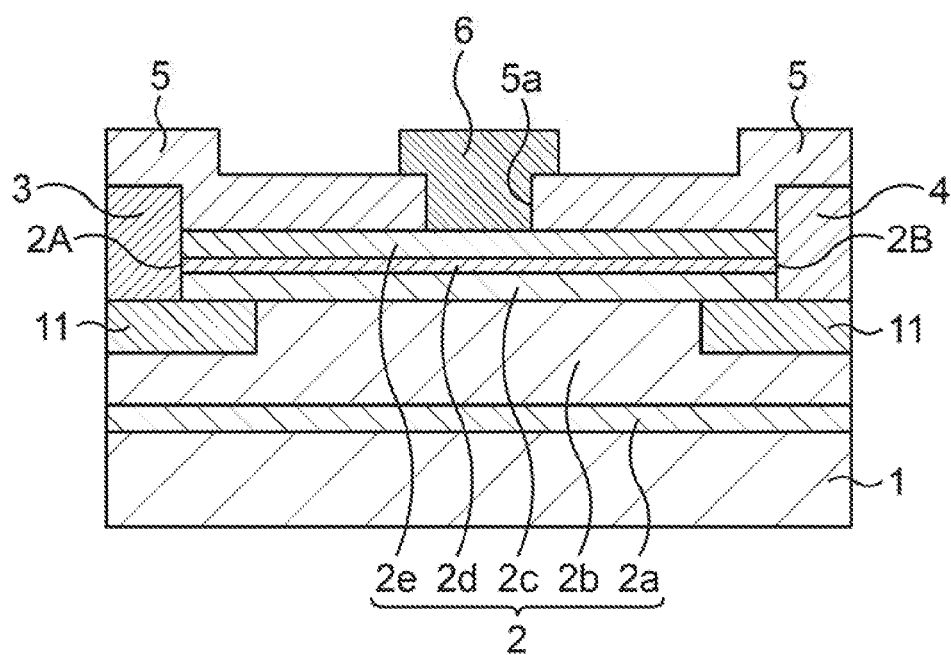

Subsequently, as illustrated in FIG. 3B, a gate electrode 6 is formed.

More specifically, a resist mask for forming the gate electrode is first formed. Here, for example, an eaves-structure two-layer resist suitable for the vapor deposition method and the lift-off method is used. This resist is applied on a protective insulating film to form therein an opening to expose the electrode trench 5a portion of the passivation film 5. Thereby, the resist mask having the opening is formed.

With the use of this resist mask, as an electrode material, for example, Ni/Au are deposited on the resist mask including the inside of the opening that exposes the electrode trench 5a portion of the passivation film 5 by the vapor deposition method, for example. The thickness of Ni is set to about 30 nm, and the thickness of Au is set to about 400 nm. By the lift-off method, the resist mask and Ni/Au deposited thereon are removed. Thereby, the gate electrode 6 made by embedding part of the electrode material in the electrode trench 5a is formed.

Thereafter, through processes such as forming an interlayer insulating film, forming wirings connected to the source electrode 4, the drain electrode 5, and the gate electrode 6, forming an upper protective film, forming a connection electrode exposed on the uppermost surface and so on, the InAlN/GaN-HEMT according to this embodiment is formed.

Hereinafter, there will be explained operations and effects exhibited by the InAlN/GaN-HEMT according to this embodiment based on comparisons with a comparative example.

Figure 4:
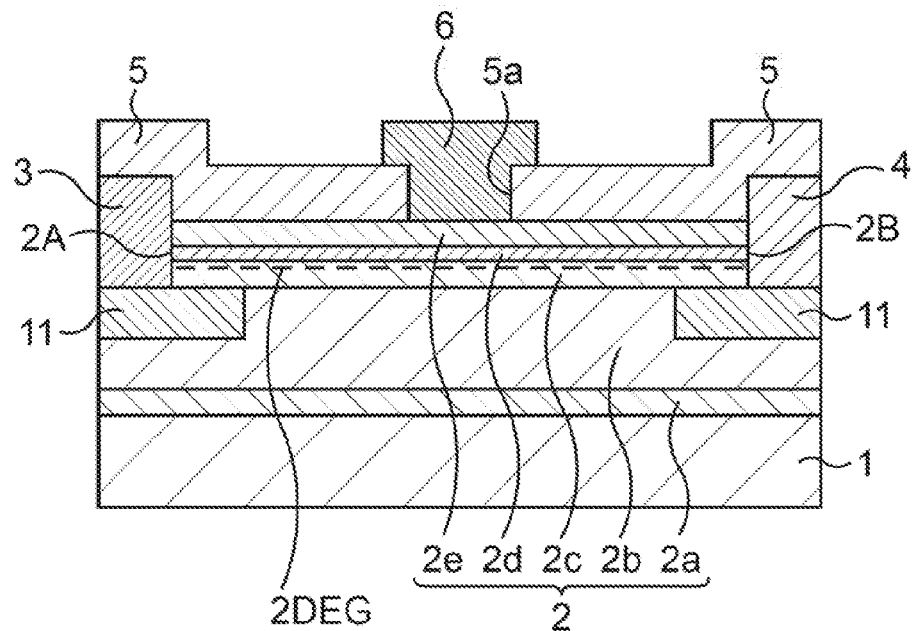
FIG. 4 is a schematic cross-sectional view illustrating a structure of the InAlN/GaN-HEMT according to the first embodiment.
Figure 5:
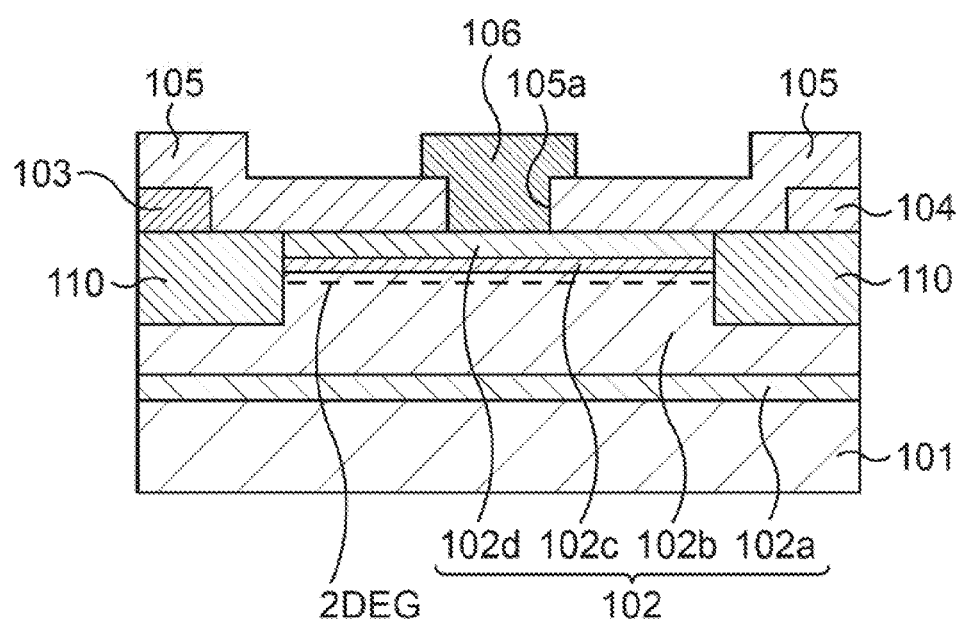
FIG. 5 a schematic cross-sectional view illustrating a structure of an InAlN/GaN-HEMT of a comparative example of the first embodiment.

FIG. 4 is a schematic cross-sectional view illustrating a structure of the InAlN/GaN-HEMT corresponding to FIG. 3B of this embodiment. FIG. 5 is a schematic cross-sectional view illustrating a structure of an InAlN/GaN-HEM of a comparative example of this embodiment.

In the InAlN/GaN-HEMT of the comparative example, on an SiC substrate 101, a compound semiconductor stacked structure 102 is formed, and a source electrode 103 and a drain electrode 104 are formed thereon. A passivation film 105 covering the entire surface of the compound semiconductor stacked structure 102 is formed, and a gate electrode 106 embedded in an electrode trench 105a formed in the passivation film 105 is formed. The compound semiconductor stacked structure 102 is constituted by including: a nucleation layer 102a; an channel layer 102b of GaN; a spacer layer 102c of AlN; and an barrier layer 102d of InAlN, and including n-type contact regions 110 formed therein. The contact regions 110 are formed by ion-implanting Si into portions of the barrier layer 102d, the spacer layer 102c, and the channel layer 102b after the nucleation layer 102a, the channel layer 102b, the spacer layer 102c, and the barrier layer 102d are formed. The source electrode 103 and the drain electrode 104 are formed in contact with InAlN of the contact regions 110 (the barrier layer 102d). After forming the contact regions 110, a heat treatment at about 1100° C. is performed for the purpose of activation of added Si and recovery of crystallinity.

In the InAlN/GaN-HEMT of the comparative example, at the time of the above-described heat treatment, the barrier layer 102d of InAlN is greatly thermally damaged. In contrast to this, in this embodiment, as described above, after the contact regions 11 are heat treated for the purpose of activation of Si and recovery of crystallinity, the barrier layer 2e of InAlN is formed, resulting in that the barrier layer 2e is not thermally damaged.

Figure 6:
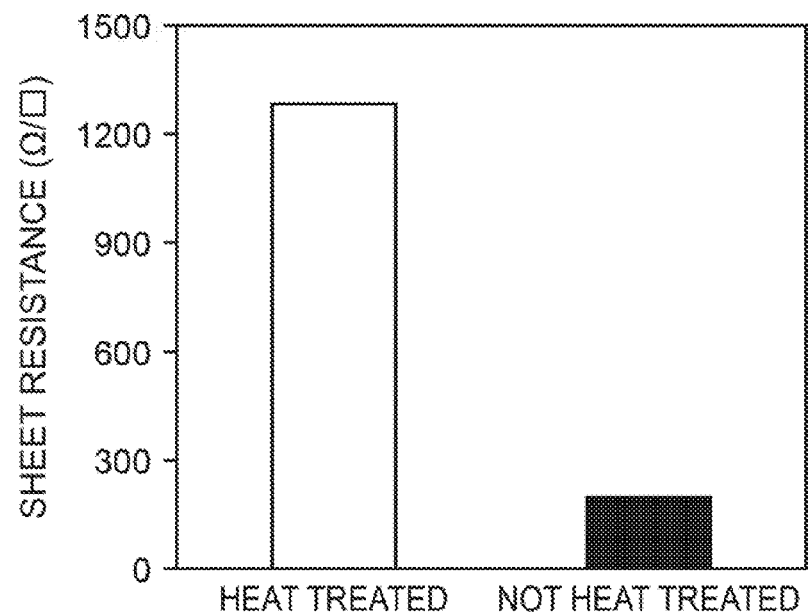
FIG. 6 is a characteristic diagram where a comparison is made between a sheet resistance when an barrier layer of InAlN is heat treated (the comparative example) and a sheet resistance when an barrier layer of InAlN is not heat treated (this embodiment)

FIG. 6 is a characteristic diagram where a comparison is made between a sheet resistance when the barrier layer of InAlN is heat treated (the comparative example) and a sheet resistance when the barrier layer of InAlN is not heat treated (this embodiment).

By measurement results in FIG. 6, it has been confirmed that the sheet resistance drastically reduces in this embodiment as compared to the comparative example.

In the InAlN/GaN-HEMT of the comparative example, the source electrode 103 and the drain electrode 104 come into contact with InAlN of the contact regions 110 (the barrier layer 102d). In contrast to this, in this embodiment, as described above, the source electrode 3 and the drain electrode 4 come into contact with GaN of the contact regions 11 (the buffer layer 2b).

Figure 7:
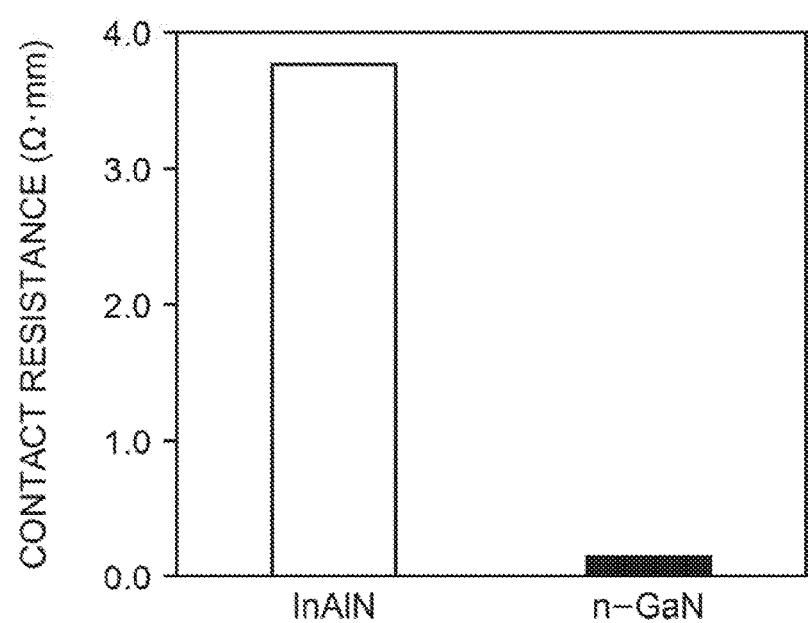
FIG. 7 is a characteristic diagram where a comparison is made between a contact resistance when a source electrode and a drain electrode come into contact with InAlN (the comparative example) and a contact resistance when a source electrode and a drain electrode come into contact with n-GaN (this embodiment)

FIG. 7 is a characteristic diagram where a comparison is made between a contact resistance when the source electrode and the drain electrode come into contact with InAlN and a contact resistance when the source electrode and the drain electrode come into contact with GaN (this embodiment).

By measurement results in FIG. 7, it has been confirmed that the contact resistance drastically reduces in this embodiment as compared to the case when no ion implantation is performed.

In the InAlN/GaN-HEMT of the comparative example, as illustrated in FIG. 5, 2DEG occurring in the channel layer 102b comes into line contact with the contact regions 110. Therefore, the contact area of the contact regions 110 with the 2DEG is small and the contact resistance is high. In this embodiment, as illustrated in FIG. 4, each one portion of the contact regions 11 projects to the portion positioned between the drain electrode 3 and the gate electrode 6 and to the portion positioned between the source electrode 1 and the gate electrode 6. The channel layer 2c is formed so as to be in contact with the top surfaces of these projecting portions. By this structure, the 2DEG occurring in the channel layer 2c comes into surface contact with the contact regions 11. Therefore, the contact area of the contact regions 11 with the 2DEG is large and the contact resistance drastically reduces as compared to the comparative example.

As explained above, according to this embodiment, it is possible to obtain the highly reliable InAlN/GaN-HEMT having reduced sheet resistance, contact resistance, and further contact resistance of an electrode and having drastically improved on-resistance.

Second Embodiment

In this embodiment, an InAlN/GaN-HEMT is disclosed similarly to the first embodiment, but is different from the first embodiment in that it is an MIS type.

Figure 8A:
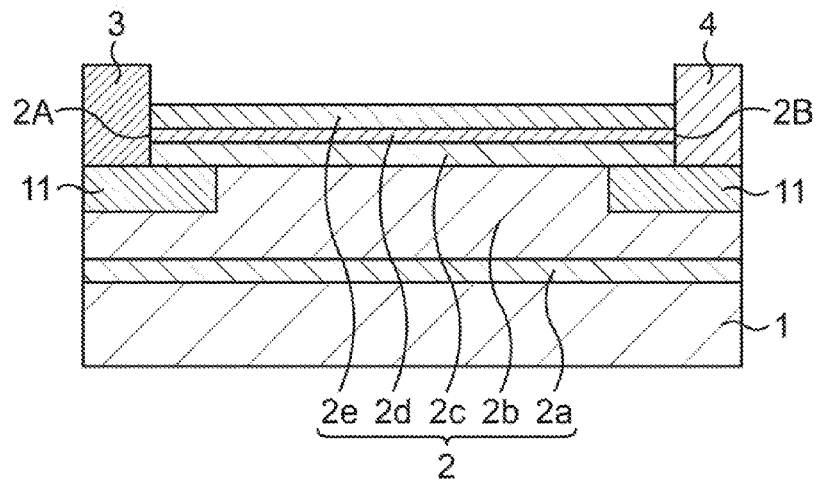
FIG. 8A to FIG. 8C are schematic cross-sectional views each illustrating a principal process of a manufacturing method of an InAlN/GaN-HEMT according to a second embodiment in order of processes.
Figure 8B:
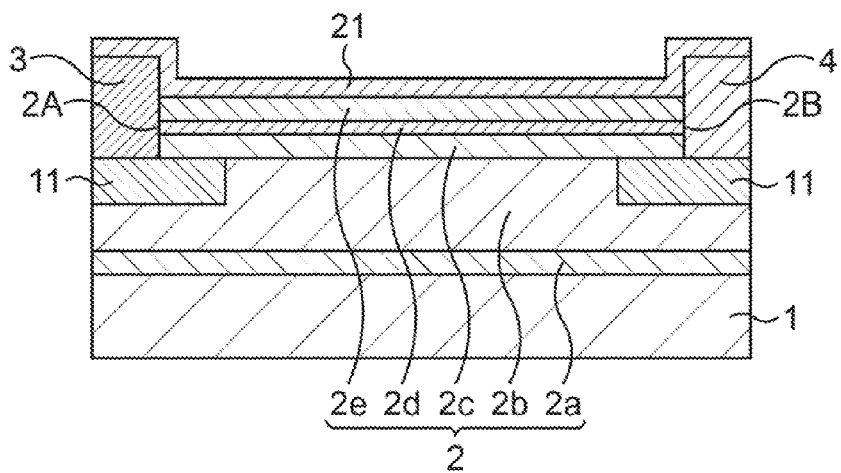
Figure 8C:
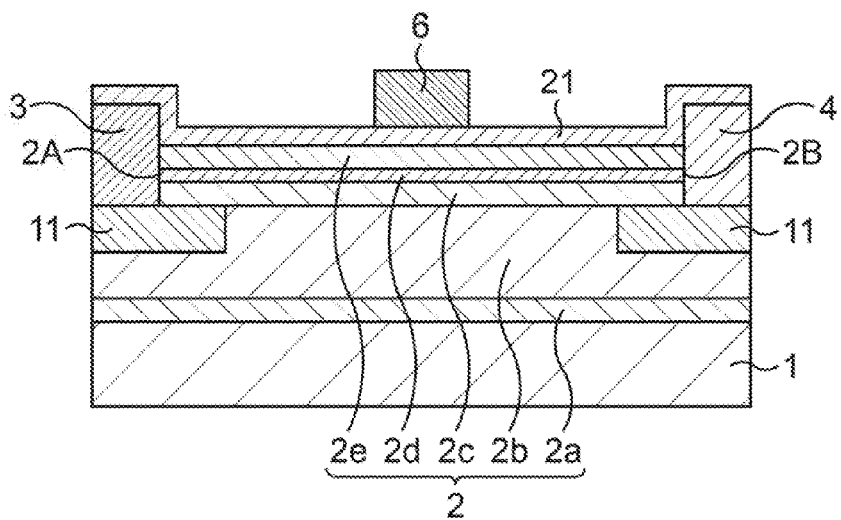

FIG. 8A to FIG. 8C are schematic cross-sectional views each illustrating a principal process of a manufacturing method of the InAlN/GaN-HEMT according to the second embodiment in order of processes. Note that the ones corresponding to the constituent members in the first embodiment will be denoted by the same reference signs.

Similarly to the first embodiment, various processes in FIG. 1A to FIG. 2B are performed. The state corresponding to FIG. 2B is illustrated in FIG. 8A.

Subsequently, as illustrated in FIG. 8B, a gate insulating film 21 is formed.

More specifically, for example, $Al_2O_3$ is deposited on the entire surface of the compound semiconductor stacked structure 2 to have a thickness of about 2 nm to about 200 nm, for example, about 20 nm by the ALD method or the like so as to cover the source electrode 3 and the drain electrode 4. Thereby, the gate insulating film 21 is formed. In place of the ALD method, the sputtering method, the plasma CVD method, or the like may also be used. As the material for the gate insulating film 21, oxides, nitrides, oxynitrides using Si, Al, Hf, Zr, Ti, Ta, or W, or a stacked structure of these is preferred.

Subsequently, as illustrated in FIG. 8C, a gate electrode 6 is formed.

More specifically, a resist mask for forming the gate electrode is first formed. A resist is applied on the gate insulating film 21 to form therein an opening to expose a gate electrode formation planned site of the gate insulating film 21. Thereby, the resist mask having the opening is formed.

With the use of this resist mask, as an electrode material, for example, Ni/Au are deposited on the resist mask including the inside of the opening that exposes the gate electrode formation planned site of the gate insulating film 21 by the vapor deposition method, for example. The thickness of Ni is set to about 30 nm, and the thickness of Au is set to about 400 nm. By the lift-off method, the resist mask and Ni/Au deposited thereon are removed. Thereby, the gate electrode 6 is formed on the gate insulating film 21.

Thereafter, through processes such as forming an interlayer insulating film, forming wirings connected to the source electrode 4, the drain electrode 5, and the gate electrode 6, forming an upper protective film, forming a connection electrode exposed on the uppermost surface and so on, the InAlN/GaN-HEMT according to this embodiment is formed.

As explained above, according to this embodiment, it is possible to obtain the highly reliable InAlN/GaN-HEMT having reduced sheet resistance, contact resistance, and further contact resistance of an electrode and having drastically improved on-resistance.

Third Embodiment

In this embodiment, an InAlN/GaN-HEMT is disclosed similarly to the first embodiment, but is different from the first embodiment in that the composition of the buffer layer is different.

FIG. 9A to FIG. 11B are schematic cross-sectional views each illustrating a manufacturing method of the InAlN/GaN-HEMT according to the third embodiment in order of processes. Note that the ones corresponding to the constituent members in the first embodiment will be denoted by the same reference signs.

Figure 9A:
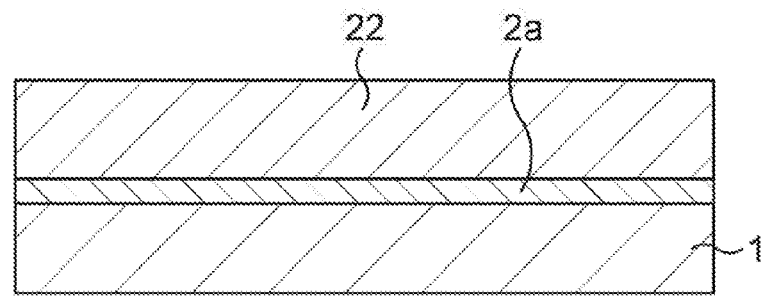
FIG. 9A to FIG. 9C are schematic cross-sectional views each illustrating a principal process of a manufacturing method of an InAlN/GaN-HEMT according to a third embodiment in order of processes.

First, as illustrated in FIG. 9A, a nucleation layer 2a and a buffer layer 22 are sequentially formed.

More specifically, for example, on an SiC substrate 1 as a growth substrate, AlN is grown to have a thickness of about 100 nm and AlGaN is grown to have a thickness of about 3 μm sequentially by the MOVPE method. Thereby, the nucleation layer 2a and the buffer layer 22 are formed in layers on the SiC substrate 1. As for AlGaN of the buffer layer 22, the composition of Al is preferably set to about 30% or less, and is set to about 5% here. The composition of AlGaN of the buffer layer 22 can be represented as $Al_{x2}Ga_{1-x2}N$ ($0 \le x2 \le 0.3$).

Figure 9B:
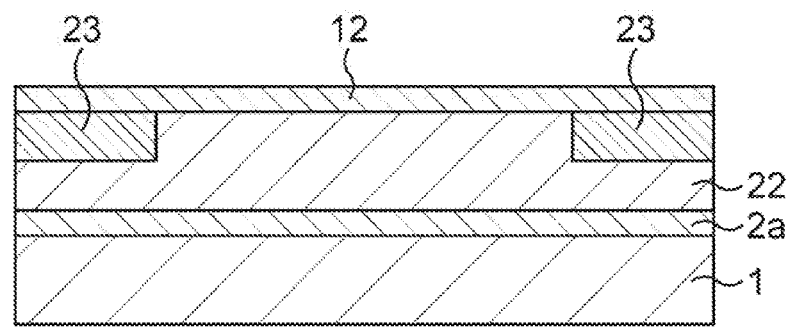

Subsequently, as illustrated in FIG. 9B, contact regions 23 are formed.

More specifically, an n-type impurity, Si here, is ion-implanted into source electrode and drain electrode formation planned sites of the surface of the buffer layer 22. A dose amount of the ion implantation is set to about $1 \times 10^{13}/cm^2$, and an acceleration voltage is set to about 20 keV. Thereby, the contact regions 23 are formed in one portion (a surface layer portion) of the buffer layer 22. The Si concentration of the contact region 23 is set to a value falling within a range of about $1 \times 10^{17}/cm^3$ to about $1 \times 10^{21}/cm^3$. When the concentration is lower than about $1 \times 10^{17}/cm^3$, sufficient conductivity cannot be obtained. When the concentration is higher than about $1 \times 10^{21}/cm^3$, an adverse effect on an channel layer 2c and the like is concerned. The Si concentration falling within a range of about $1 \times 10^{17}/cm^3$ to about $1 \times 10^{21}/cm^3$ is set, thereby making it possible to obtain sufficient conductivity without adversely affecting the channel layer 2c and the like. As the n-type impurity for the ion implantation, one type or two or more types selected from Si, Ge, Sn, and O can be used.

Then, on the buffer layer 22 and on the contact regions 23, a protective film 12 being a silicon oxide film or the like is formed by the thermal CVD method, for example, to be heat treated. The temperature of the heat treatment is about 1000° C. or more, and is set to about 1100° C. This heat treatment activates Si added into the contact regions 23 and recovers crystallinity of AlGaN of the contact regions 23 (the buffer layer 22). Thereafter, the protective film 12 is removed by wet etching.

Figure 9C:
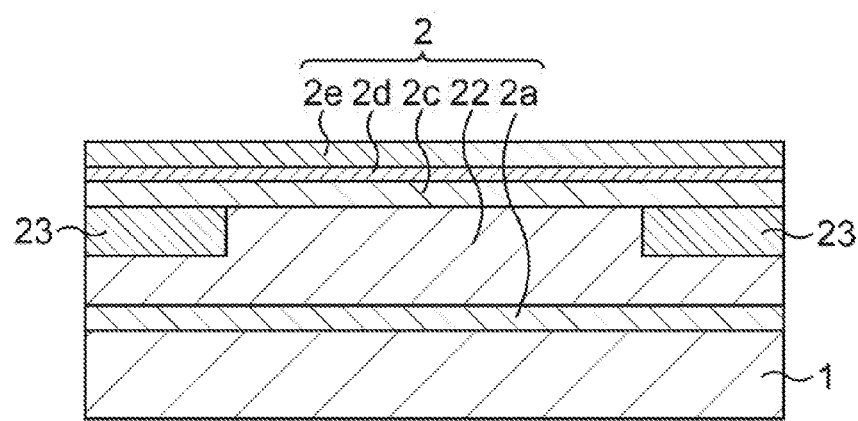

Subsequently, as illustrated in FIG. 9C, the channel layer 2c, a spacer layer 2d, and an barrier layer 2e are formed sequentially.

More specifically, by the MOVPE method, on the top surface of the buffer layer 22 and on the top surface of the contact regions 23, GaN is grown to have a thickness of about 30 nm, AlN is grown to have a thickness of about 1 nm, and InAlN is grown to have a thickness of about 10 nm respectively. Thereby, the channel layer 2c, the spacer layer 2d, and the barrier layer 2e are formed in layers on the top surface of the buffer layer 22 and on the top surface of the contact regions 23. Thereby, a compound semiconductor stacked structure 2 including: the nucleation layer 2a; the buffer layer 22; the channel layer 2c; the spacer layer 2d; and the barrier layer 2e, and including the n-type contact regions 23 formed in one portion (the surface layer portion) of the buffer layer 2b is formed.

Figure 10A:
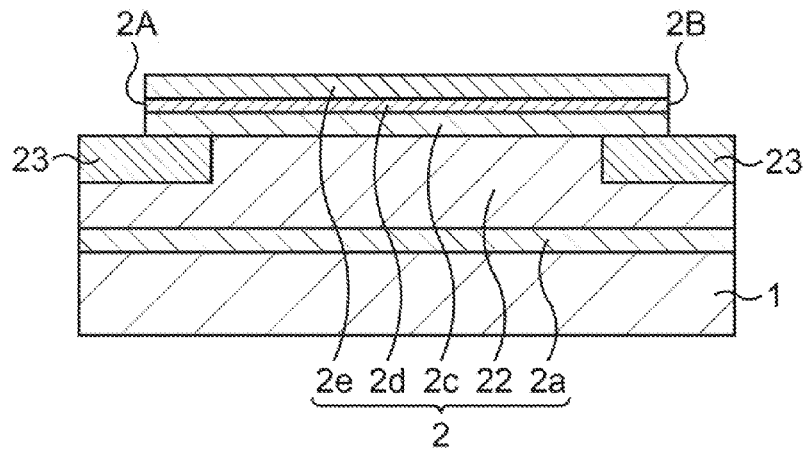
FIG. 10A to FIG. 10C are schematic cross-sectional views, subsequent to FIG. 9A to FIG. 9C, each illustrating a principal process of the manufacturing method of the InAlN/GaN-HEMT according to the third embodiment in order of processes.

Subsequently, as illustrated in FIG. 10A, electrode trenches 2A and 2B are formed at source electrode and drain electrode formation planned positions (electrode formation planned positions) in the surface of the compound semiconductor stacked structure 2.

More specifically, a resist is applied on the surface of the compound semiconductor stacked structure 2. The resist is processed by lithography to form therein openings to expose the surface of the compound semiconductor stacked structure 2 corresponding to the electrode formation planned positions. Thereby, a resist mask having the openings is formed.

With the use of this resist mask, the electrode formation planned positions of the channel layer 2c, the spacer layer 2d, and the barrier layer 2e are removed by dry etching until the surface of the contact regions 23 is exposed. Thereby, the electrode trenches 2A and 2B exposing the electrode formation planned positions of the surface of the contact regions 23 are formed. An etching condition is set that an inert gas such as Ar and a chlorine-based gas such as $Cl_2$ are used as an etching gas, a flow amount of, for example, $Cl_2$ is about 30 sccm, a pressure is about 2 Pa, and an RF input power is about 20 W. Thereafter, the resist mask is removed by ashing or the like.

Figure 10B:
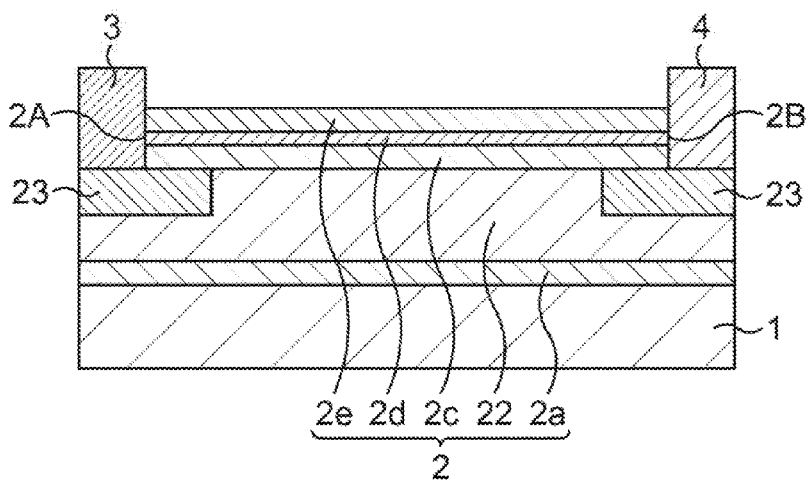

Subsequently, as illustrated in FIG. 10B, a source electrode 3 and a drain electrode 4 are formed.

More specifically, a resist mask for forming the source electrode and the drain electrode is first formed. Here, for example, an eaves-structure two-layer resist suitable for the vapor deposition method and the lift-off method is used. This resist is applied on the compound semiconductor stacked structure 2 to form therein openings exposing the electrode trenches 2A and 2B. Thereby, the resist mask having the openings is formed.

With the use of this resist mask, as an electrode material, for example, Ta/Al are deposited on the resist mask including the insides of the openings that expose the electrode trenches 2A and 2B by the vapor deposition method, for example. The thickness of Ta is set to about 20 nm, and the thickness of Al is set to about 200 nm. By the lift-off method, the resist mask and Ta/Al deposited thereon are removed. Thereafter, the SiC substrate 1 is heat treated at a temperature of about 400° C. to 1000° C., for example, about 550° C. in a nitrogen atmosphere, for example, and remaining Ta/Al are brought into ohmic contact with the contact regions 23 to establish an ohmic characteristic. As long as the ohmic characteristic of Ta/Al with the contact regions 23 can be obtained, there is sometimes a case that the heat treatment is unnecessary. Thereby, the source electrode 3 and the drain electrode 4 made by embedding part of the electrode material in the electrode trenches 2A and 2B are formed.

Figure 10C:
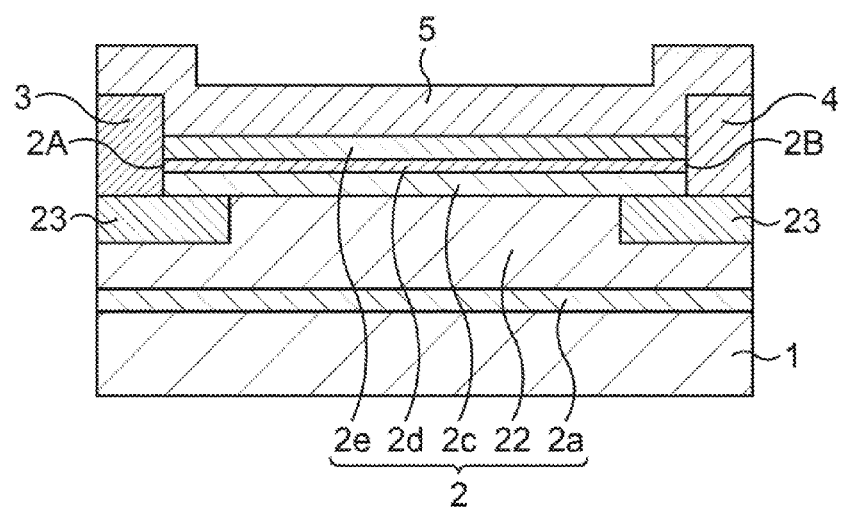

Subsequently, as illustrated in FIG. 10C, a passivation film 5 is formed.

More specifically, an insulating material, for example, a silicon nitride (SiN) is deposited on the entire surface of the compound semiconductor stacked structure 2 to have a thickness of, for example, about 2 nm to about 500 nm, for example, about 100 nm by using the plasma CVD method or the like. Thereby, the passivation film 5 is formed. In place of the plasma CVD method, the ALD method or the sputtering method may also be used. As the material for the passivation film 5, oxides, nitrides, and oxynitrides of Si, Al, Hf, Zr, Ti, Ta, or W are preferred.

Figure 11A:
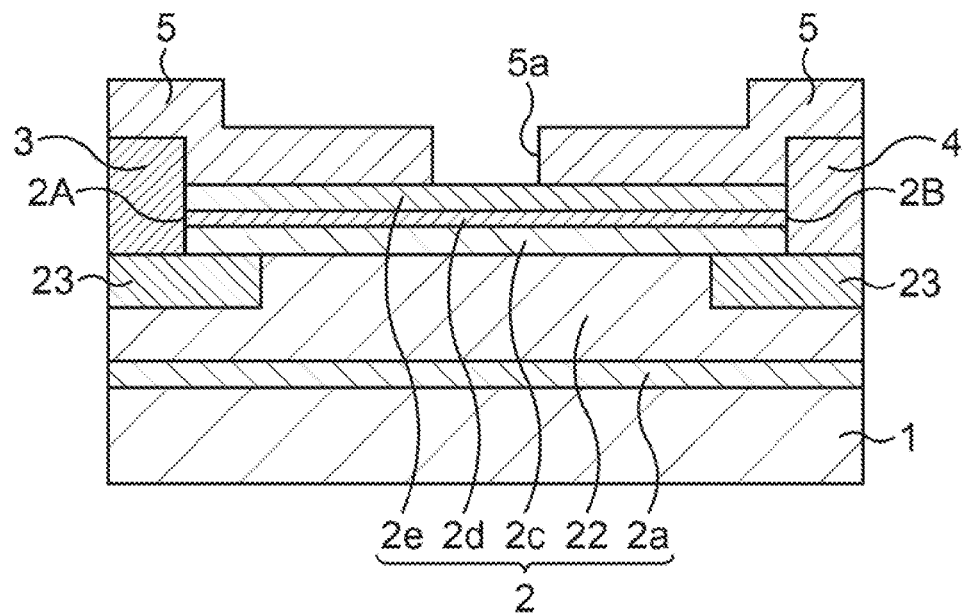
FIG. 11A and FIG. 11B are schematic cross-sectional views, subsequent to FIG. 10A to FIG. 10C, each illustrating a principal process of the manufacturing method of the InAlN/GaH-HEMT according to the third embodiment in order of processes.

Subsequently, as illustrated in FIG. 11A, an electrode trench 5a is formed in the passivation film 5.

More specifically, the passivation film 5 is first processed by lithography and dry etching. For the dry etching, a fluorine-based gas or chlorine-based gas is used. Thereby, the electrode trench 5a being a through trench that exposes the surface of the barrier layer 2e is formed in the passivation film 5.

A resist mask is removed by ashing using oxygen plasma or wetting using a chemical solution.

Figure 11B:
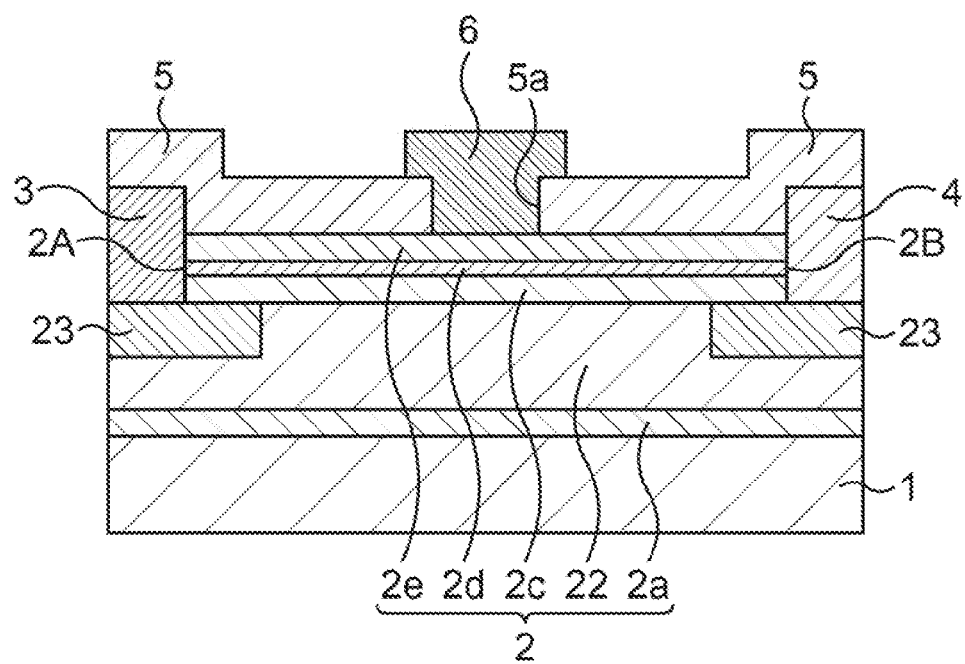

Subsequently, as illustrated in FIG. 11B, a gate electrode 6 is formed.

More specifically, a resist mask for forming the gate electrode is first formed. Here, for example, an eaves-structure two-layer resist suitable for the vapor deposition method and the lift-off method is used. This resist is applied on a protective insulating film 6 to form therein an opening to expose the electrode trench 5a portion of the passivation film 5. Thereby, the resist mask having the opening is formed.

With the use of this resist mask, as an electrode material, for example, Ni/Au are deposited on the resist mask including the inside of the opening that exposes the electrode trench 5a portion of the passivation film 5 by the vapor deposition method, for example. The thickness of Ni is set to about 30 nm, and the thickness of Au is set to about 400 nm. By the lift-off method, the resist mask and Ni/Au deposited thereon are re-moved. Thereby, the gate electrode 6 made by embedding part of the electrode material in the electrode trench 5a is formed.

Thereafter, through processes such as forming an interlayer insulating film, forming wirings connected to the source electrode 4, the drain electrode 5, and the gate electrode 6, forming an upper protective film, forming a connection electrode exposed on the uppermost surface and so on, the InAlN/GaN-HEMT according to this embodiment is formed.

As explained above, according to this embodiment, it is possible to obtain the highly reliable InAlN/GaN-HEMT having reduced sheet resistance, contact resistance, and further contact resistance of an electrode and having drastically improved on-resistance.

The InAlN/GaN-HEMTs according to the above-described first to third embodiments are each applied to what is called a discrete package.

In this discrete package, a chip of the above-described InAlN/GaN-HEMT is mounted. Hereinafter, there will be exemplified the discrete package of the chip of the InAlN/GaN-HEMT according to each of the first to third embodiments (to be referred to as a HEMT chip below).

Figure 12:
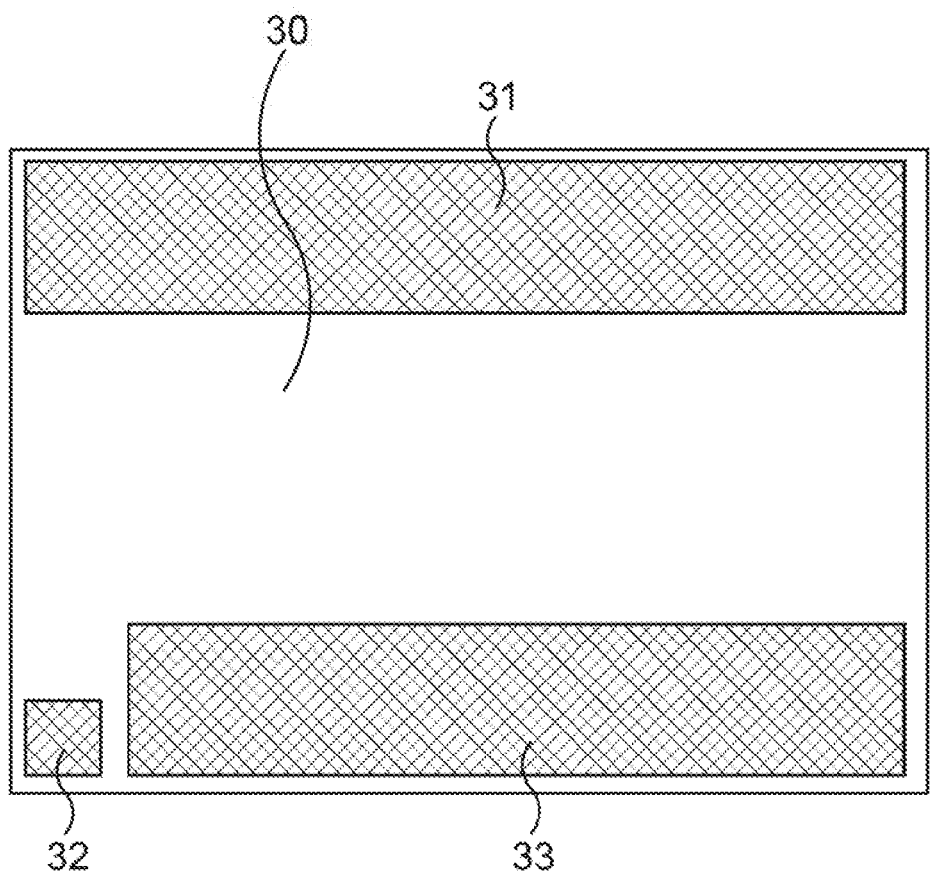
FIG. 12 is a plan view illustrating a schematic structure of an HEMT chip.

There is illustrated a schematic structure of the HEMT chip in FIG. 12.

On a surface of a HEMT chip 30, there are provided a drain pad 31 to which the drain electrode of the above-described InAlN/GaN-HEMT is connected, a gate pad 32 to which the gate electrode is connected, and a source pad 33 to which the source electrode is connected.

Figure 13:
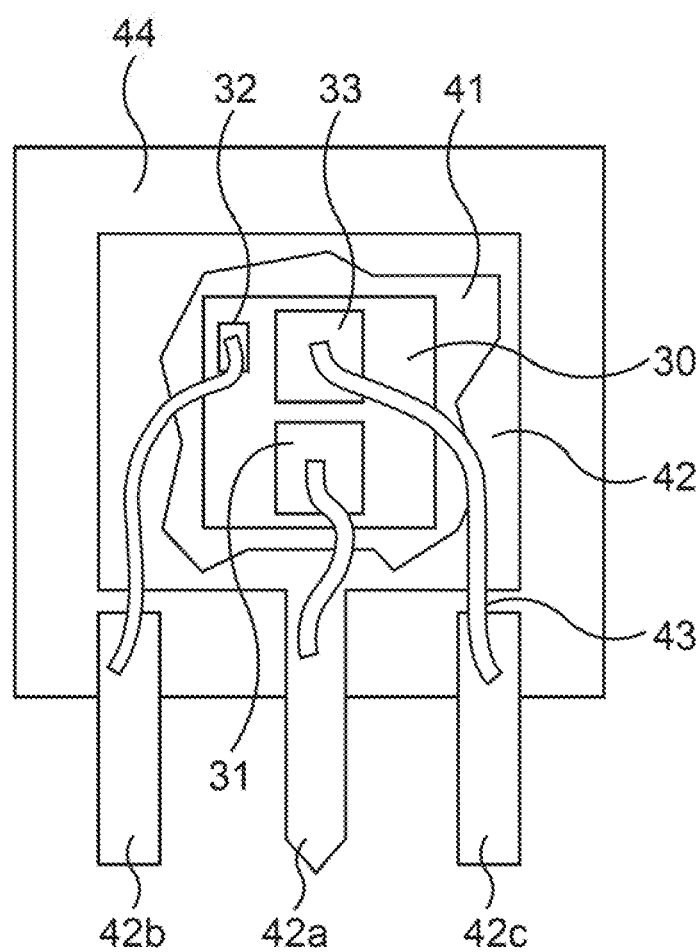
FIG. 13 is a plan view illustrating a schematic structure of a discrete package using the HEMT chip.

FIG. 13 is a schematic plan view illustrating the discrete package.

To fabricate the discrete package, the HEMT chip 30 is first fixed to a lead frame 42 by using a die attach agent 41 such as solder. A drain lead 42a is integrally formed with the lead frame 42, and a gate lead 42b and a source lead 42c are arranged apart from each other as separate structures from the lead frame 42.

Subsequently, by bonding using Al wires 43, the drain pad 31 and the drain lead 42a, the gate pad 32 and the gate lead 42b, and the source pad 33 and the source lead 42c are electrically connected.

Thereafter, by using a mold resin 44, the HEMT chip 30 is resin-sealed by a transfer mold method and the lead frame 42 is separated. Thereby, the discrete package is formed.

Fourth Embodiment

This embodiment discloses a PFC (Power Factor Correction) circuit including the InAlN/GaN-HEMT selected from the first to third embodiments.

Figure 14:
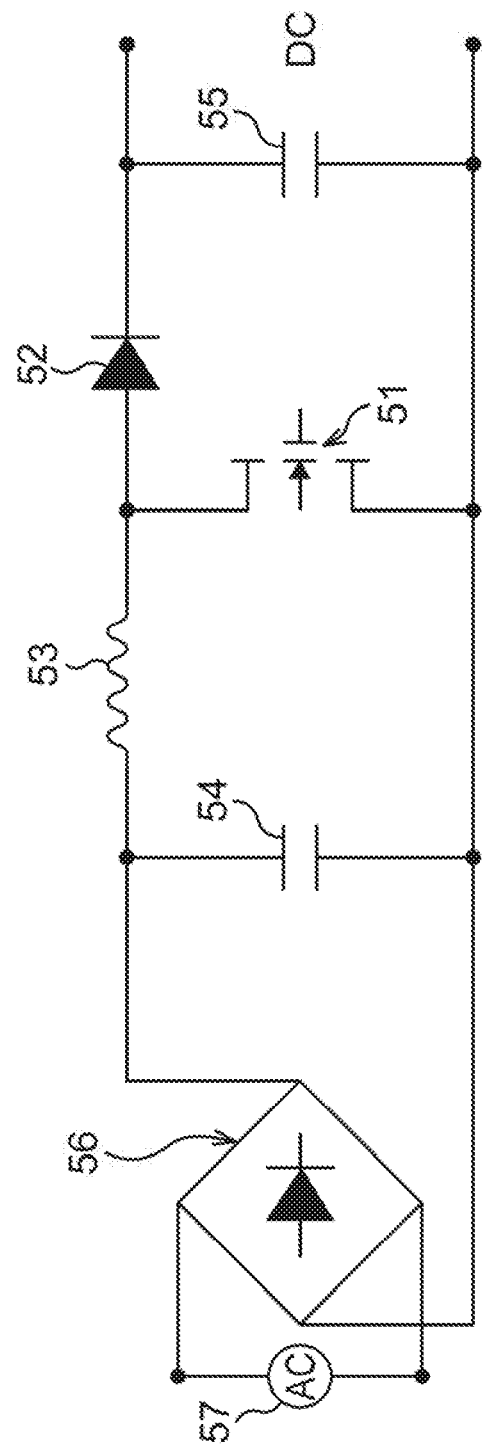
FIG. 14 is a connection diagram illustrating a PFC circuit according to a fourth embodiment.

FIG. 14 is a connection diagram illustrating the PFC circuit.

A PFC circuit 50 is constituted by including: a switch element (transistor) 51; a diode 52; a choke coil 53; capacitors 54 and 55; a diode bridge 56; and an AC power source (AC) 57. The InAlN/GaN-HEMT selected from the first to third embodiments is applied to the switch element 51.

In the PFC circuit 50, a drain electrode of the switch element 51 is connected to an anode terminal of the diode 52 and one terminal of the choke coil 53. A source electrode of the switch element 51 is connected to one terminal of the capacitor 54 and one terminal of the capacitor 55. The other terminal of the capacitor 54 and the other terminal of the choke coil 53 are connected to each other. The other terminal of the capacitor 55 and a cathode terminal of the diode 52 are connected to each other. Between the both terminals of the capacitor 54, the AC 57 is connected via the diode bridge 56. Between the both terminals of the capacitor 55, a DC power source (DC) is connected.

In this embodiment, the highly reliable InAlN/GaN-HEMT having reduced sheet resistance, contact resistance, and further contact resistance of an electrode and having drastically improved on-resistance is applied to the PFC circuit 50. Thereby, the PFC circuit 50 having high reliability is fabricated.

Fifth Embodiment

This embodiment discloses a power supply device including the InAlN/GaN-HEMT selected from the first to third embodiments.

Figure 15:
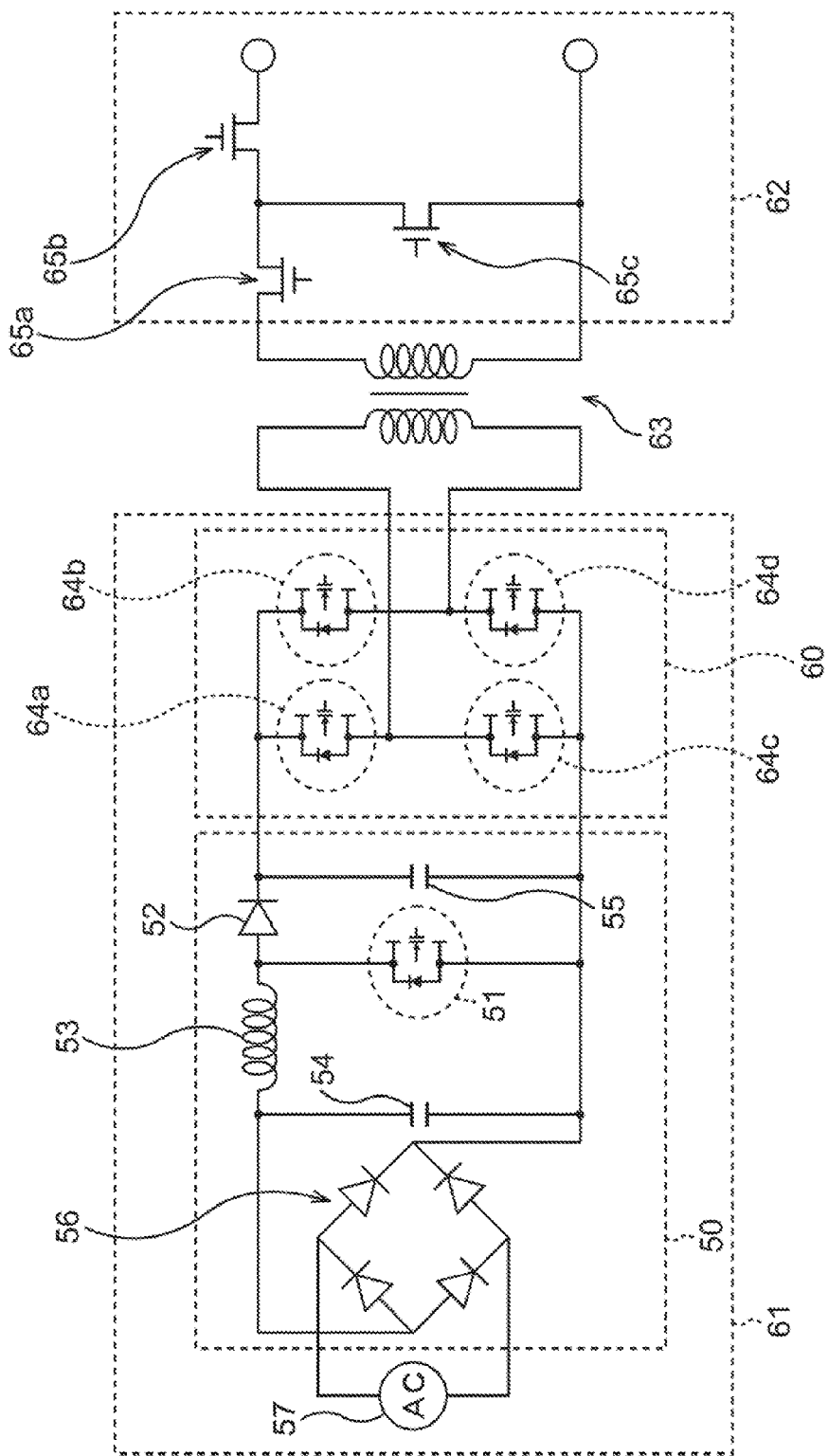
FIG. 15 is a connection diagram illustrating a schematic configuration of a power supply device according to a fifth embodiment.

FIG. 15 is a connection diagram illustrating a schematic configuration of the power supply device according to the fifth embodiment.

The power supply device according to this embodiment is configured by including: a high-voltage primary-side circuit 61; a low-voltage secondary-side circuit 62; and a transformer 63 disposed between the primary-side circuit 61 and the secondary-side circuit 62.

The primary-side circuit 61 includes: the PFC circuit 50 according to the second embodiment; and an inverter circuit, for example, a full bridge inverter circuit 60 connected between the both terminals of the capacitor 55 of the PFC circuit 50. The full bridge inverter circuit 60 is configured by including a plurality of (four here) switch elements 64a, 64b, 64c, and 64d.

The secondary-side circuit 62 is configured by including a plurality of (three here) switch elements 65a, 65b, and 65c.

In this embodiment, similarly to the switch element 51 of the PFC circuit 50 configuring the primary-side circuit 61, the switch elements 64a, 64b, 64c, and 64d of the full bridge inverter circuit 60 are each the InAlN/GaN-HEMT selected from the first to third embodiments. On the other hand, the switch elements 65a, 65b, and 65c of the secondary-side circuit 62 are each a normal MIS-FET using silicon.

In this embodiment, the highly reliable InAlN/GaN-HEMT having reduced sheet resistance, contact resistance, and further contact resistance of an electrode and having drastically improved on-resistance is applied to the primary-side circuit 61 being the high-voltage circuit. Thereby, a high-output power supply device having high reliability is fabricated.

Sixth Embodiment

This embodiment discloses a high-frequency amplifier including the InAlN/GaN-HEMT selected from the first to third embodiments.

Figure 16:
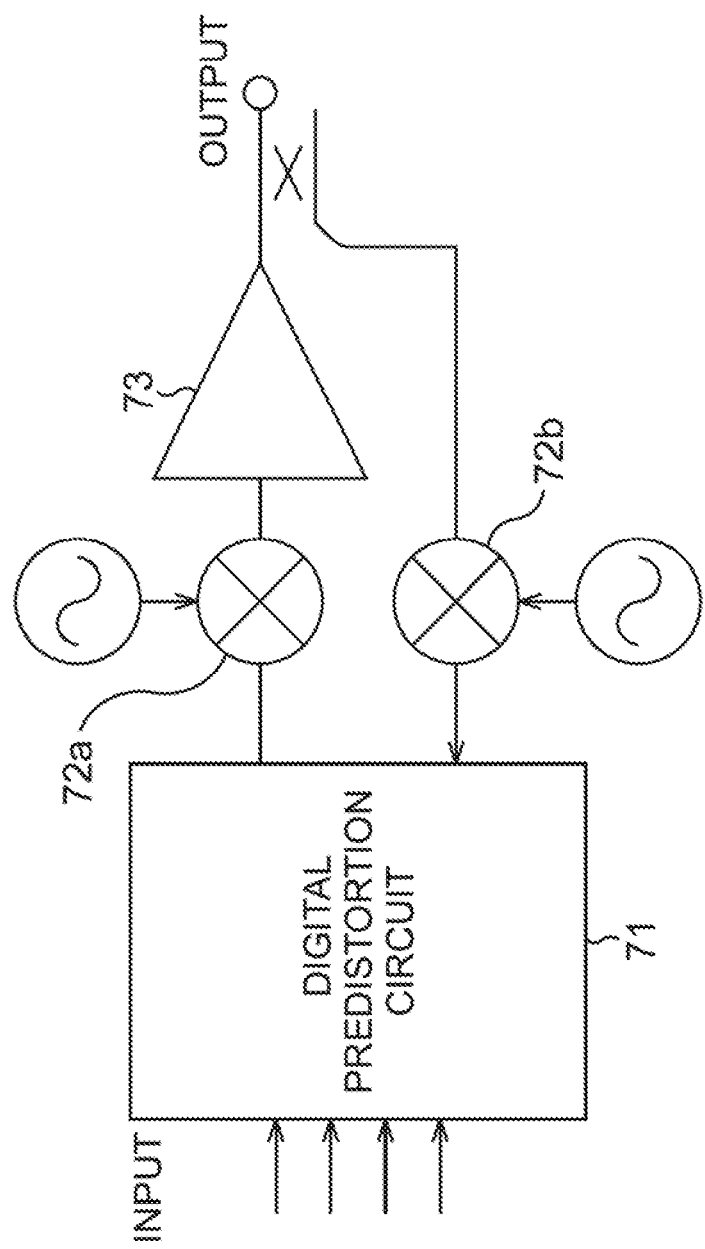
FIG. 16 is a connection diagram illustrating a schematic configuration of a high-frequency amplifier according to a sixth embodiment.

FIG. 16 is a connection diagram illustrating a schematic configuration of the high-frequency amplifier according to the sixth embodiment.

The high-frequency amplifier according to this embodiment is configured by including: a digital predistortion circuit 71; mixers 72a and 72b; and a power amplifier 73.

The digital predistortion circuit 71 compensates nonlinear distortion of an input signal. The mixer 72a mixes the input signal whose nonlinear distortion is compensated and an AC signal. The power amplifier 73 amplifies the input signal mixed with the AC signal, and includes the InAlN/GaN-HEMT selected from the first to third embodiments. Incidentally, in FIG. 16, by, for example, changing the switches, an output-side signal can be mixed with the AC signal by the mixer 72b, and the resultant can be sent out to the digital predistortion circuit 71.

In this embodiment, the highly reliable InAlN/GaN-HEMT having reduced sheet resistance, contact resistance, and further contact resistance of an electrode and having drastically improved on-resistance is applied to the high-frequency amplifier. Thereby, a highly reliable high-withstand-voltage high-frequency amplifier is fabricated.

In the first to sixth embodiments, the InAlN/GaN-HEMT is exemplified as a compound semiconductor device, but an InAlGaN/GaN-HEMT can also be applied as well as the InAlN/GaN-HEMT. In the case of the InAlGaN/GaN-HEMT, the barrier layer 2d is formed of InAlGaN. The composition of the barrier layer 2d, as InAlN or InAlGaN, can be represented as $In_{x1}Al_{y1}Ga_{z1}N$ ($0 \leq x1 < 1$, and $0 < y1 < 1$, and $0 \leq z1 < 1$, and $x1+z1 > 0$, and $x1+y1+z1=1$).

Further, an AlGaN/GaN-HEMT can also be applied as well as the InAlN/GaN-HEMT. In the case of the AlGaN/GaN-HEMT, the barrier layer 2d is formed of AlGaN. The composition of the barrier layer 2d, as InAlN, InAlGaN, or AlGaN, can be represented as $In_{x1}Al_{y1}Ga_{z1}N$ ($0 \leq x1 < 1$, and $0 < y1 < 1$, and $0 \leq z1 < 1$, and $x1+z1 > 0$, and $x1+y1+z1=1$).

According to the above-described various aspects, there is fabricated a highly reliable compound semiconductor device having reduced sheet resistance, contact resistance, and further contact resistance of an electrode and having drastically improved on-resistance.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A compound semiconductor device, comprising:
    a buffer layer;
    an n-type conductive region that is formed at one portion of the buffer layer;
    a channel layer that is formed on a top surface of the buffer layer and on a top surface of the n-type conductive region;
    a barrier layer that is formed above the channel layer and contains $In_{x1}Al_{y1}Ga_{z1}N$ ($0 \leq x1 < 1$, and $0 < y1 < 1$, and $0 \leq z1 < 1$, and $x1+z1 > 0$, and $x1+y1+z1=1$); and
    an electrode that is formed on the n-type conductive region.

2. The compound semiconductor device according to claim 1, wherein
    the buffer layer contains $Al_{x2}Ga_{1-x2}N$ ($0 \leq x2 \leq 0.3$).

3. The compound semiconductor device according to claim 1, further comprising:
    a spacer layer that contains $In_{x3}Al_{y3}Ga_{1-x3-y3}N$ ($0 \leq x3 \leq 0.05$ and $0 < y3 \leq 1$) between the channel layer and the barrier layer.

4. The compound semiconductor device according to claim 1, wherein
    an n-type impurity concentration of the n-type conductive region is a value falling within a range of $1 \times 10^{17}/cm^3$ to $1 \times 10^{21}/cm^3$.

5. The compound semiconductor device according to claim 1, wherein
    an n-type impurity concentration of the channel layer is equal to or less than $1 \times 10^{17}/cm^3$.

6. A manufacturing method of a compound semiconductor device, comprising:
    forming a buffer layer;
    forming an n-type conductive region at one portion of the buffer layer;
    forming a channel layer on a top surface of the buffer layer and on a top surface of the n-type conductive region;
    forming, above the channel layer, an barrier layer that contains $In_{x1}Al_{y1}Ga_{z1}N$ ($0 \leq x1 < 1$, and $0 < y1 < 1$, and $0 \leq z1 < 1$, and $x1+z1 > 0$, and $x1+y1+z1=1$); and
    forming an electrode on the n-type conductive region.

7. The manufacturing method of the compound semiconductor device according to claim 6, further comprising:
    after forming the n-type conductive region and before forming the channel layer, heat-treating the n-type conductive region.

8. The manufacturing method of the compound semiconductor device according to claim 6, wherein
    the buffer layer contains $Al_{x2}Ga_{1-x2}N$ ($0 \leq x2 \leq 0.3$).

9. The manufacturing method of the compound semiconductor device according to claim 6, further comprising:
    forming, between the channel layer and the barrier layer, a spacer layer that contains $In_{x3}Al_{y3}Ga_{1-x3-y3}N$ ($0 \leq x3 \leq 0.05$ and $0 < y3 \leq 1$).

10. The manufacturing method of the compound semiconductor device according to claim 6, wherein
    an n-type impurity concentration of the n-type conductive region is a value falling within a range of $1 \times 10^{17}/cm^3$ to $1 \times 10^{21}/cm^3$.

11. The manufacturing method of the compound semiconductor device according to claim 6, wherein
    an n-type impurity concentration of the channel layer is equal to or less than $1 \times 10^{17}/cm^3$.

12. A power supply circuit comprising a transformer and a high-voltage circuit and a low-voltage circuit across the transformer, the high-voltage circuit comprising a transistor,
the transistor comprising:
a buffer layer;
an n-type conductive region that is formed at one portion of the buffer layer;
a channel layer that is formed on a top surface of the buffer layer and on a top surface of the n-type conductive region;
a barrier layer that is formed above the channel layer and contains $In_{x1}Al_{y1}Ga_{z1}N$ ($0 \leq x1 < 1$, and $0 < y1 < 1$, and $0 \leq z1 < 1$, and $x1+z1 > 0$, and $x1+y1+z1=1$); and
an electrode that is formed on the n-type conductive region.

13. A high-frequency amplifier that amplifies an input high-frequency voltage and outputs a resultant high-frequency voltage, the high-frequency amplifier comprising:
a transistor,
the transistor comprising:
a buffer layer;
an n-type conductive region that is formed at one portion of the buffer layer;
a channel layer that is formed on a top surface of the buffer layer and on a top surface of the n-type conductive region;
a barrier layer that is formed above the channel layer and contains $In_{x1}Al_{y1}Ga_{z1}N$ ($0 \leq x1 < 1$, and $0 < y1 < 1$, and $0 \leq z1 <$, and $x1+z1 > 0$, and $x1+y1+z1=1$); and
an electrode that is formed on the n-type conductive region.

* * * * *